United States Patent
Clark et al.

(10) Patent No.: US 8,039,738 B2
(45) Date of Patent: *Oct. 18, 2011

(54) ACTIVE RARE EARTH TANDEM SOLAR CELL

(75) Inventors: Andrew Clark, Palo Alto, CA (US);
Robin Smith, Palo Alto, CA (US);
Richard Sewell, Palo Alto, CA (US);
Scott Semans, Palo Alto, CA (US); F. Erdem Arkun, Palo Alto, CA (US);
Michael Lebby, Palo Alto, CA (US)

(73) Assignee: Translucent, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/619,637

(22) Filed: Nov. 16, 2009

(65) Prior Publication Data
US 2010/0116315 A1    May 13, 2010

Related U.S. Application Data

(63) Continuation-in-part of application No. 11/828,964, filed on Jul. 26, 2007, and a continuation-in-part of application No. 12/408,297, filed on Mar. 20, 2009, and a continuation-in-part of application No. 12/510,977, filed on Jul. 28, 2009.

(51) Int. Cl.
*H01L 31/055* (2006.01)
*H01L 31/028* (2006.01)

(52) U.S. Cl. .......................... 136/257; 136/261

(58) Field of Classification Search .............. 136/261, 136/257
See application file for complete search history.

(56) References Cited

U.S. PATENT DOCUMENTS

| | | | |
|---|---|---|---|
| 4,842,960 A | 6/1989 | Lindmayer | |
| 4,891,507 A | 1/1990 | Lindmayer | |
| 5,012,098 A | 4/1991 | Lindmayer | |
| 6,541,788 B2 | 4/2003 | Petroff | |
| 6,621,211 B1 * | 9/2003 | Srivastava et al. | 313/503 |
| 6,734,453 B2 | 5/2004 | Atanackovic | |
| 6,852,575 B2 | 2/2005 | Bojarczuk, Jr. et al. | |
| 6,858,864 B2 | 2/2005 | Atanackovic | |
| 6,943,385 B2 | 9/2005 | Usuda | |
| 7,008,559 B2 | 3/2006 | Chen | |
| 7,018,484 B1 | 3/2006 | Atanackovic | |
| 7,023,011 B2 | 4/2006 | Atanackovic | |
| 7,037,806 B1 | 5/2006 | Atanackovic | |
| 7,129,551 B2 | 10/2006 | Osten | |
| 7,135,699 B1 | 11/2006 | Atanackovic | |
| 7,199,015 B2 | 4/2007 | Atanackovic | |

(Continued)

OTHER PUBLICATIONS

Curtin, B.M.;"Photonic crystal back-reflectors for light management and enhanced absorption in a-Si:H solar cells"; M.Sc. Thesis, 2009; Iowa State University.

Hetzer, M.J.; "Chemical and electronic characterization of copper indium gallium diselenide thin film solar cells and correlation of these characterisitics to solar cell operation"; Ph.D. thesis, 2009; Ohio State University.

(Continued)

*Primary Examiner* — Jennifer K. Michener
*Assistant Examiner* — Dustin Q Dam
(74) *Attorney, Agent, or Firm* — Fernandez & Associates, LLP

(57) ABSTRACT

The use of rare-earth (RE and O, N, P) based materials to transition between two different semiconductor materials and enable up and/or down conversion of incident radiation is disclosed. Rare earth based oxides, nitrides and phosphides provide a wide range of lattice spacing enabling, compressive, tensile or stress-free lattice matching with Group IV, III-V, and Group II-VI compounds.

15 Claims, 16 Drawing Sheets

U.S. PATENT DOCUMENTS

| | | |
|---|---|---|
| 7,199,451 B2 | 4/2007 | Kelman |
| 7,211,821 B2 | 5/2007 | Atanackovi |
| 7,217,636 B1 | 5/2007 | Atanackovic |
| 7,253,080 B1 | 8/2007 | Atanackovic |
| 7,273,657 B2 | 9/2007 | Atanackovic |
| 7,351,993 B2 | 4/2008 | Atanackovic |
| 7,384,481 B2 | 6/2008 | Atanackovic |
| 7,416,959 B2 | 8/2008 | Atanakovic |
| 7,432,550 B2 | 10/2008 | Bojarczuk, Jr. et al. |
| 7,501,627 B1 | 3/2009 | Herr |
| 2005/0145972 A1* | 7/2005 | Fukuda et al. ............. 257/458 |
| 2005/0156155 A1* | 7/2005 | Atanackovic ............... 257/19 |
| 2005/0161773 A1 | 7/2005 | Atanackovic |
| 2005/0163692 A1 | 7/2005 | Atanackovic |
| 2006/0060826 A1 | 3/2006 | Atanackovic |
| 2006/0145186 A1* | 7/2006 | Wallis ....................... 257/190 |
| 2008/0241519 A1 | 10/2008 | Schroeder |
| 2009/0183774 A1 | 7/2009 | Atanackovic |
| 2009/0235974 A1* | 9/2009 | Mapel et al. ............. 136/246 |

OTHER PUBLICATIONS

Zhou, D.; "Light-trapping enhancement in thin film solar cells"; M.Sc. thesis, 2008; Iowa State University.

Mutitu, J.G., et al.; "Thin film silicon solar cell design based on photonic crystal and diffractive grating structures"; Optics Express; 16, #19, Sep. 15, 2008; 15238.

Dewan, R., et al; "Light trapping in thin-film silicon solar cells with integrated diffraction grating"; Jl. Appl. Physics, 106, 074901, 2009.

Bermal, P., et al.; "Improving Thin-Film Crystalline Silicon Solar Cell Efficiencies With Photonic Crystals"; Optics Express; 15, #15, Dec. 10, 2007; 16986.

Richards, B., et al.; "Enhancing the near-infrared spectral response of silicon optoelectronic devices via up-conversion"; IEEE Transactions on Electron Devices, 54, #10, Oct. 2007.

Sewell, R.H., et al.; "Epitaxial rare-earth oxide layers for enhancement of silicon based solar cells"; 24th European Photovoltaic Solar Energy Conference 2009.

\* cited by examiner

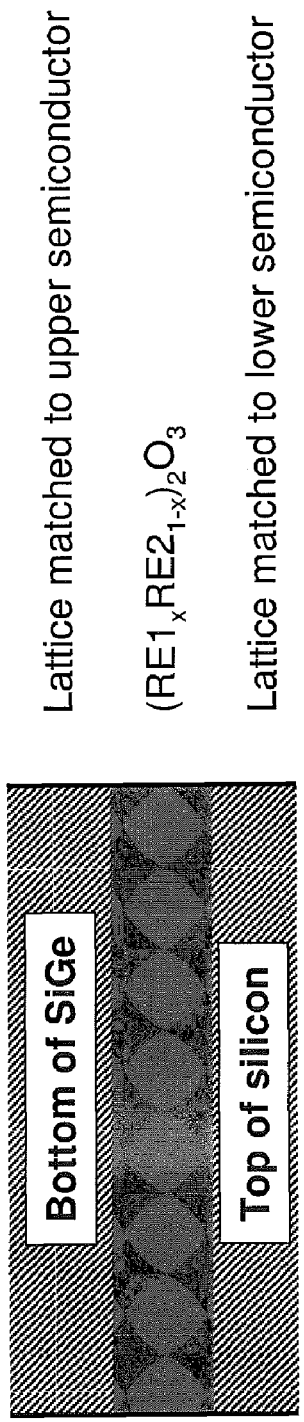
Figure 7a    Details of mechanical transition layer
Figure 7b    Details of optical conversion layer

ACTIVE RARE EARTH TANDEM SOLAR CELL

PRIORITY

This application is a continuation-in-part of application Ser. Nos. 11/828,964, filed on Jul. 26, 2007, 12/408,297, filed on Mar. 20, 2009 and 12/510,977, filed on Jul. 28, 2009 and claims priority from these applications, all three included herein in their entirety by reference.

CROSS REFERENCE TO RELATED APPLICATIONS

Application and patent Ser. Nos. 11/025,692, 11/025,693, U.S.20050166834, Ser. Nos. 11/253,525, 11/257,517, 11/257,597, 11/393,629, 11/472,087, 11/559,690, 11/599,691, 11/788,153, 11/828,964, 11/858,838, 11/873,387 11/960,418, 11/961,938, 12/119,387, 60/820,438, 61/089,786, 12/029,443, 12/046,139, 12/111,568, 12/119,387, 12/171,200, 12/408,297, 12/510,977, 60/847,767, U.S. Pat. No. 6,734,453, U.S. Pat. No. 6,858,864, U.S. Pat. No. 7,018,484, U.S. Pat. No. 7,023,011 U.S. Pat. No. 7,037,806, U.S. Pat. No. 7,135,699, U.S. Pat. No. 7,199,015, U.S. Pat. No. 7,211,821, U.S. Pat. No. 7,217,636, U.S. Pat. No. 7,273,657, U.S. Pat. No. 7,253,080, U.S. Pat. No. 7,323,737, U.S. Pat. No. 7,351,993, U.S. Pat. No. 7,355,269, U.S. Pat. No. 7,364,974, U.S. Pat. No. 7,384,481, U.S. Pat. No. 7,416,959, U.S. Pat. No. 7,432,569, U.S. Pat. No. 7,476,600, U.S. Pat. No. 7,498,229, U.S. Pat. No. 7,586,177, U.S. Pat. No. 7,599,623 and U.S. Applications titled "Photovoltaic conversion using rare earths plus Group IV sensitizers", [P047]; "Photovoltaic conversion using rare earths plus transition metal sensitizers", [P048]; "Rare earth structures with semiconductor layers", [P046]; and "Passive rare earth tandem solar cell", [P050]; all held by the same assignee, contain information relevant to the instant invention and are included herein in their entirety by reference. References, noted in the specification and Information Disclosure Statement, are included herein in their entirety by reference.

BACKGROUND OF THE INVENTION

1. Field of the Invention

The invention relates generally to a semiconductor based structure for an active tandem solar cell transitioning from one semiconductor material composition to another by the use of one or more transition layers comprising one or more rare earth compounds enabling control of the stress field between layers and providing means for up and/or down conversion of incident radiation.

2. Description of Related Art Including Information Disclosed Under 37 CFR 1.97 and 1.98

As a complementary approach to single or multiple junction solar cells where specific materials are matched to discrete portions of the solar spectrum, wavelength conversion works on the principle of moving parts of the spectrum to the wavelength band of a particular junction cell. For example it is widely accepted that a single junction, single crystal silicon solar cell has an optimum performance in the wavelength range 500 to 1,100 nm, whilst the solar spectrum extends from below 400 nm to in excess of 2500 nm. A tandem cell enables a device to convert a larger portion of the solar spectrum with minimal increase in size and cost.

Rare earths, the lanthanide series, have long been known for the unique optical properties in which the incomplete, 4f shells exhibit multiple optical transitions many of which lie within the solar spectrum. An example of some of these optical transitions are: Er: 410, 519, 650, 810, 972, 1,529 nm; Yb: 980 nm; Tb: 485 nm As used herein a rare earth, [RE1, RE2, ... RE$_n$], is chosen from the lanthanide series of rare earths from the periodic table of elements {$^{57}$La, $^{58}$Ce, $^{59}$Pr, $^{60}$Nd, $^{61}$Pm, $^{62}$Sm, $^{63}$Eu, $^{64}$Gd, $^{65}$Tb, $^{66}$Dy, $^{67}$Ho, $^{68}$Er, $^{69}$Tm, $^{70}$Yb and $^{71}$Lu} plus yttrium, $^{39}$Y, and scandium, $^{21}$Sc, are included as well for the invention disclosed.

As used herein a transition metal, [TM1, TM2 ... TM$_n$], is chosen from the transition metal elements consisting of {$^{22}$Ti, $^{23}$V, $^{24}$Cr, $^{25}$Mn, $^{26}$Fe, $^{27}$Co, $^{28}$Ni, $^{29}$Cu, $^{30}$Zn, $^{40}$Zr, $^{41}$Nb, $^{42}$Mo, $^{43}$Tc, $^{44}$Ru, $^{45}$Rh, $^{46}$Pd, $^{47}$Ag, $^{48}$Cd, $^{71}$Lu, $^{72}$Hf, $^{73}$Ta, $^{74}$W, $^{75}$Re, $^{76}$Os, $^{77}$Ir, $^{78}$Pt, $^{77}$Au, $^{80}$Hg}; additional ones are found in the technical literature and known to one knowledgeable in the art. Silicon and germanium refer to elemental silicon and germanium; Group IV, Groups III and V and Groups II and VI elements have the conventional meaning. As used herein all materials and/or layers may be present in a single crystalline, polycrystalline, nanocrystalline, nanodot or quantum dot and amorphous form and/or mixture thereof.

In addition, certain of these rare earths, sometimes in combination with one or more rare earths, and one or more transition metals can absorb light at one wavelength (energy) and re-emit at another wavelength (energy). This is the essence of conversion; when the incident, adsorbed, radiation energy per photon is less than the emission, emitted, energy per photon the process is referred to as "up conversion". "Down conversion" is the process in which the incident energy per photon is higher than the emission energy per photon. An example of up conversion is Er absorbing at 1,480 nm and exhibiting photoluminescence at 980 nm.

One concept is disclosed in U.S. Pat. No. 3,929,510; more recent work in this field has mainly focused on the addition of rare earths to phosphorescent compounds. The historical approaches however add a conversion layer to either a completed solar cell or module with the majority also requiring an additional reflective component to return the converted spectrum back into the cell so that it can contribute to the generated photocurrent. U.S. Pat. No. 7,184,203 discloses up and down conversion with a rare earth compound comprising a rare earth element and at least one other element selected from chalcogens, halogens, nitrogen, phosphorus and carbon; wherein the rare earth compound is not mixed with compounds containing other rare earth elements and wherein the rare earth compound is irradiated at a sufficient intensity to heat the rare earth compound to facilitate electronic transitions. U.S. Pat. No. 7,184,203 does not teach or suggest using a rare earth compound in conjunction with a photovoltaic device; U.S. Pat. No. 7,184,203 teaches away from the use of a rare earth compound with relatively low intensity radiation at room temperature for up or down conversion.

U.S. Pat. No. 6,613,974 discloses a tandem Si—Ge solar cell with improved efficiency; the disclosed structure is a silicon substrate onto which a Si—Ge epitaxial layer is deposited and then a silicon cap layer is grown over the Si—Ge layer; no mention of rare earths is made. U.S. Pat. No. 7,364,989 discloses a silicon substrate, forming a silicon alloy layer of either Si—Ge or Si—C and the depositing a single crystal rare earth oxide, binary or ternary; the alloy content of the alloy layer is adjusted to select a type of strain desired; the preferred type of strain is "relaxed"; the preferred deposition method for the rare earth oxide is atomic layer deposition at temperatures below 300° C. While the Si—Ge film is "relaxed", its primary function is to impart no strain, tensile strain or compressive strain to the rare earth oxide layer; the goal being to improve colossal magnetoresistive, CMR, properties of the rare earth oxide. A preferred method disclosed requires a manganese film be deposited on a silicon alloy first. Recent work on rare earth films deposited by an ALD process indicate the films are typically polycrystalline or amorphous.

U.S. Pat. No. 7,148,417 discloses a first solar cell comprising silicon and a second GaP solar cell. U.S. Pat. No. 6,613,974 discloses a second solar cell comprising silicon-germanium formed on a silicon substrate. U.S. Pat. No. 6,566,595 discloses a tandem solar cell comprising a compound semiconductor and a quantum well layer of a second compound semiconductor. U.S. Pat. No. 6,372,980 discloses a two terminal tandem solar cell comprising InGaAs and GaAs. U.S. Pat. No. 6,340,788 discloses a Si or SiGe solar cell comprising multiple subcells; optionally, transition layer(s) of GaPAs and GaInP are part of the structure. U.S. Pat. No. 6,166,320 discloses a tandem solar cell comprising a first solar cell stacked upon a second solar cell. The cited prior art does not disclose a tandem solar cell comprising a rare earth transition layer of varying composition.

BRIEF SUMMARY OF THE INVENTION

In one embodiment the instant invention discloses thin film structures operable as an active tandem solar cell device. The use of rare-earth based materials to transition between two different semiconductor materials is disclosed. Rare earth based oxides, nitrides and phosphides provide a wide range of lattice spacing enabling, compressive, tensile or stress-free lattice matching with Group IV, III-V, and Group II-VI compounds. Disclosed embodiments include tandem solar cells wherein rare earth transition layers also provide up and down conversion of incident radiation.

One advantage of thin films is the control provided over a process both in tuning a material to a particular wavelength and in reproducing the process in a manufacturing environment. In some embodiments, rare earth oxides, nitrides, and phosphides, transition metals and silicon/germanium materials and various combinations thereof may be employed. As used herein the terms, "oxides" and "rare-earth oxide[s]" are inclusive of rare earth oxides, nitrides, and phosphides and combinations thereof.

BRIEF DESCRIPTION OF THE SEVERAL VIEWS OF THE DRAWING(S)

FIG. 1: Solar spectrum showing portions of spectrum, A, B, C, not absorbed by silicon.

FIG. 2: Composition of SiGe required to extend cutoff wavelength to include region A.

FIG. 3: Relationship between SiGe lattice spacing and rare earth lattice spacing for region A.

FIG. 4: Relationship between various optical transition in REs and regions B & C.

FIG. 5: Example of three terminal, dual back contact, tandem solar cell incorporating separate REO layers for transition and one or more rare earths distributed within a semiconductor layer.

FIG. 6: Example of three terminal, dual back contact, tandem solar cell incorporating separate REO layers for transition and up conversion, UC, layers.

FIG. 7*a*: Example of a transition layer for strain engineering between two different semiconductor layers; FIG. 7*b*: example of a layer for wavelength conversion.

FIGS. 8*a, b, c* and *d*: Exemplary grading profiles for strain engineering and/or optical conversion.

FIG. 9: Exemplary tandem solar cell with combined transition and optical conversion layer.

FIG. 10: Exemplary rare earth binary, ternary and/or quaternary for strain engineering and optical conversion.

FIGS. 11*a* and *b*: Examples of RE binary and ternary grading for strain engineering and optical conversion layers; FIG. 11*c*: exemplary structure for transitioning between two semiconductor layers incorporating strain engineering and optical conversion with multiple layers.

FIG. 12: Example of a three terminal, dual back contact, tandem solar cell combining a DBR with a transition and optical conversion, UC, REO layer.

FIG. 13: Exemplary single solar cell with front and back contacts

Figure 16A:
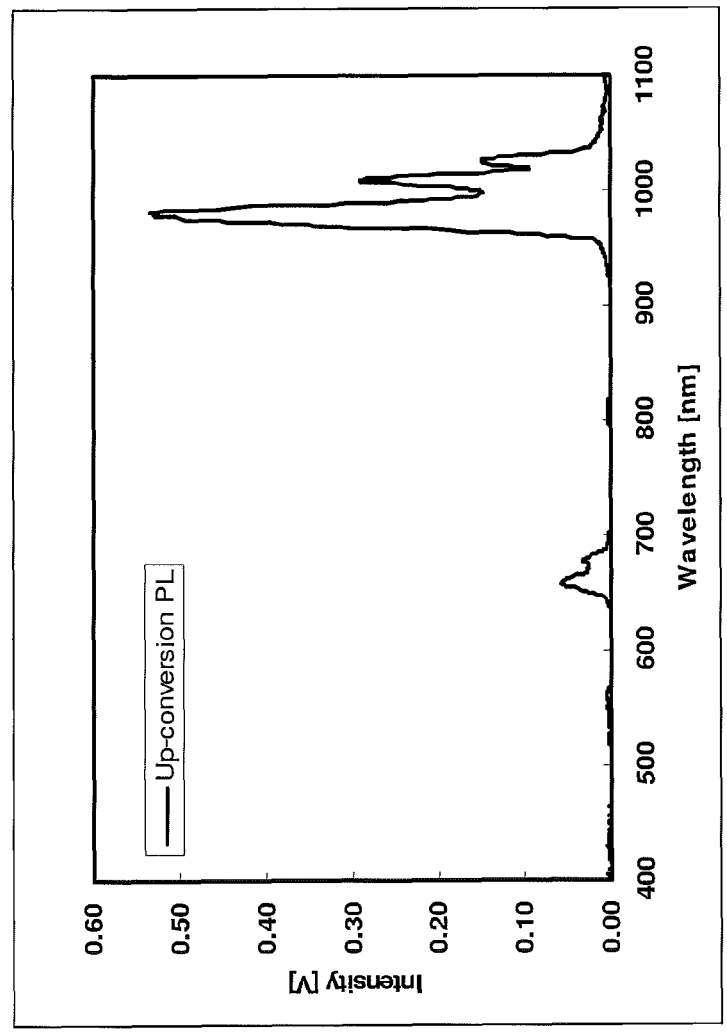
Figure 16B:
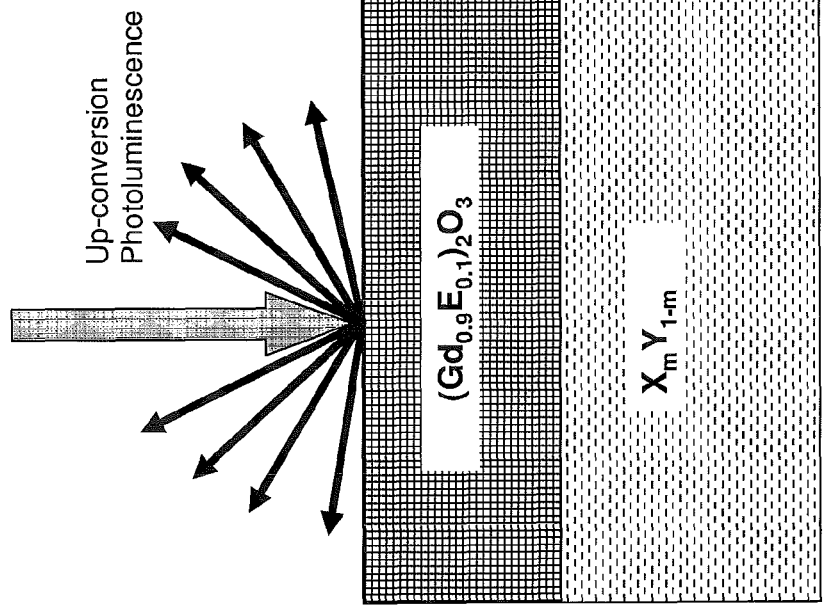

FIG. 16*a*: Photoluminescence from test structure indicating up conversion; FIG. 16*b*: Spectral scan showing emission about 650 nm and 1000 nm from 1480 nm laser on up conversion layer of FIG. 16*a* test structure.

DETAILED DESCRIPTION OF THE INVENTION

Examples of device structures utilizing layers of rare earth oxides to perform the tasks of up conversion, and/or down conversion along with, optionally, designing in required optical and/or anti reflective properties are disclosed. A substrate may be an appropriate semiconductor material, such as silicon, single, poly or multi-crystalline, silicon dioxide, glass or alumina; as used herein multi-crystalline includes poly, micro and nano crystalline. The number of REO/semiconductor bilayers may range from one to more than one hundred. "A layer" also comprises multiple layers, optionally. REO, Si(1−x)Ge(x), Si(1−y)Ge(y), and Si(1−z)Ge(z) layers are, optionally, single crystal, multi-crystalline or amorphous layers and comprise optically active rare earth dielectrics compatible with semiconductor processing techniques. As used herein a "REO" layer contains two or more elements, at least one chosen from the Lanthanide series plus Scandium and Yttrium and at least one chosen from oxygen and/or nitrogen and/or phosphorous and/or mixtures thereof; structures are not limited to specific rare-earth elements cited in examples. Rare earth materials are represented as $(RE1+RE2+ \ldots REn)_m O_n$ where the total mole fraction of rare earths, 1 . . . n, is one for stoichiometric compounds; non-stoichiometric compounds are also disclosed wherein m and n need not be integers and may vary from greater than 0 to 5. In some embodiments, in addition to the RE (1, 2, . . . n) an alloy may include Si and/or Ge and/or C, carbon; optionally an oxide may be an oxynitride or oxyphosphide.

In some embodiments a low cost substrate such as soda glass or polycrystalline alumina is used in combination with a rare-earth based structure comprising a diffusion barrier layer, a buffer layer, an active region, up and/or down layer(s), one or more reflectors, one or more Bragg layers; texturing is optional; one or more layers may comprise a rare-earth. The exact sequence of the layers is application dependent; in some cases sunlight may enter a transparent substrate initially; in other cases a transparent substrate may be interior of multiple layers.

Figure 1:
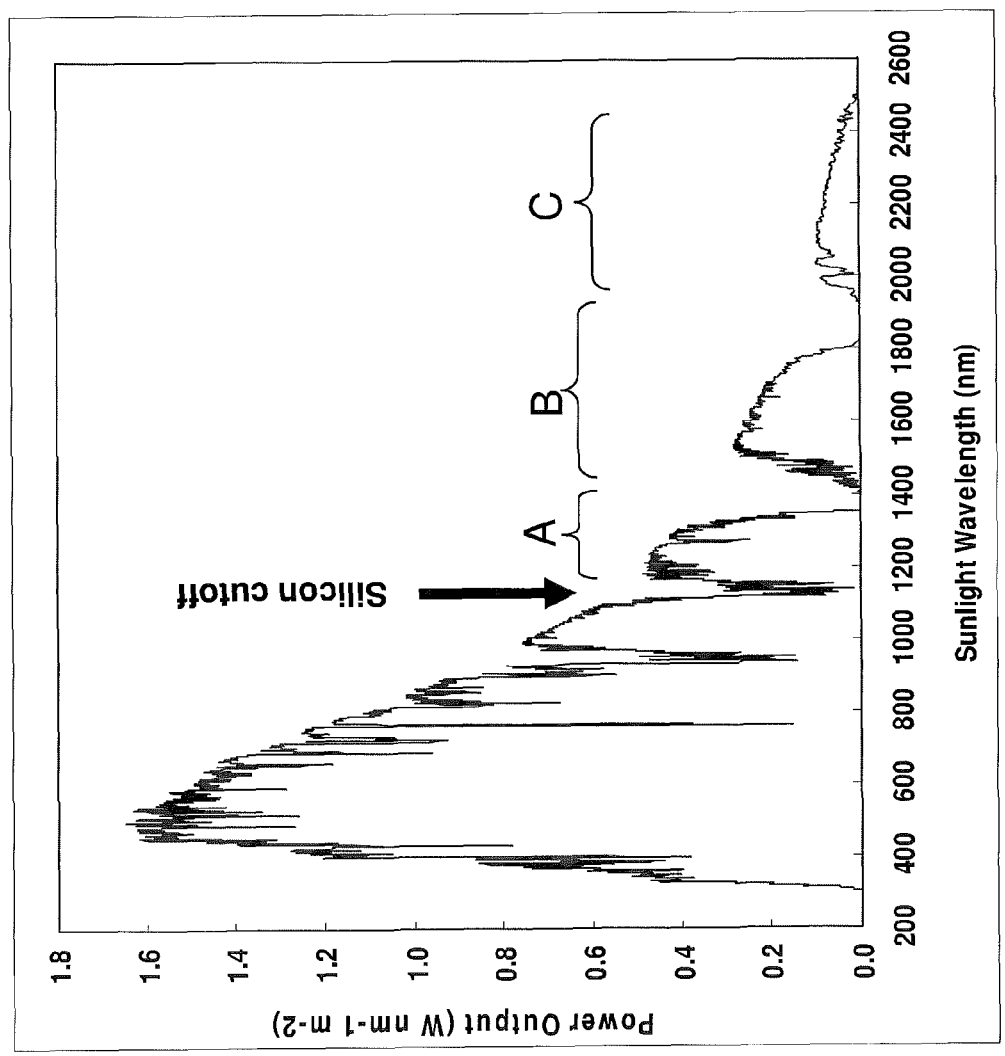
Figure 2:
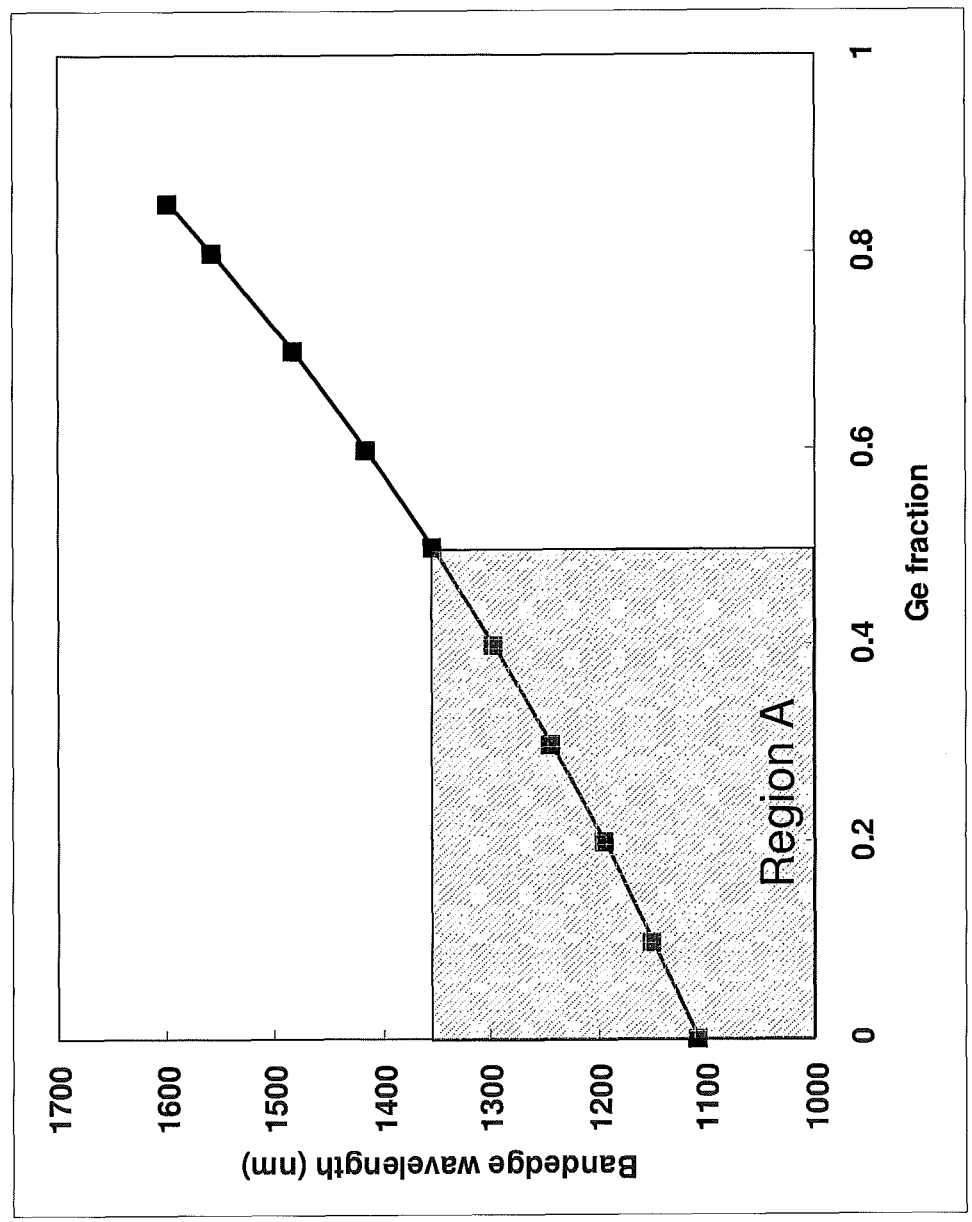
Figure 3:
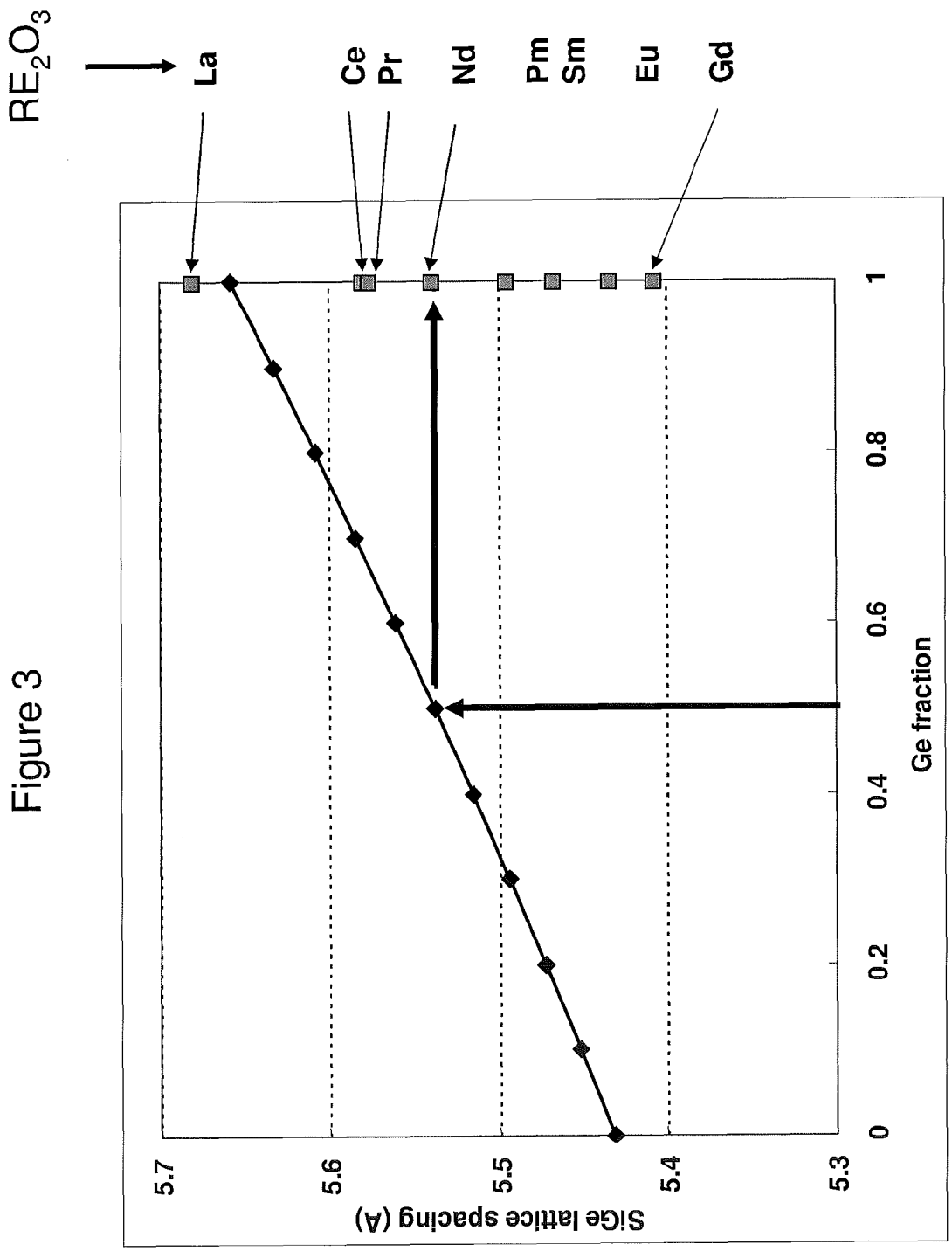
Figure 4:
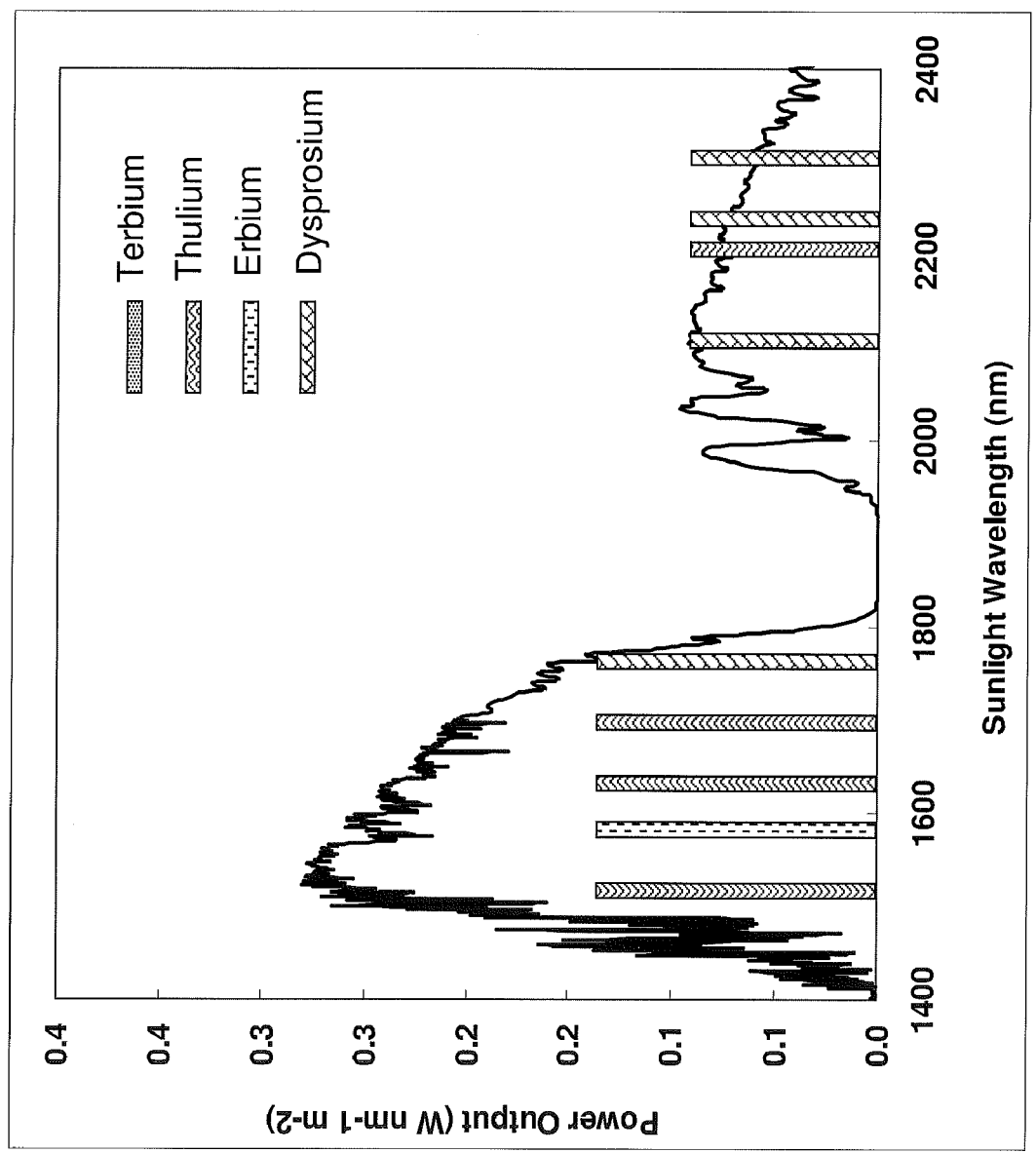
Figure 5:
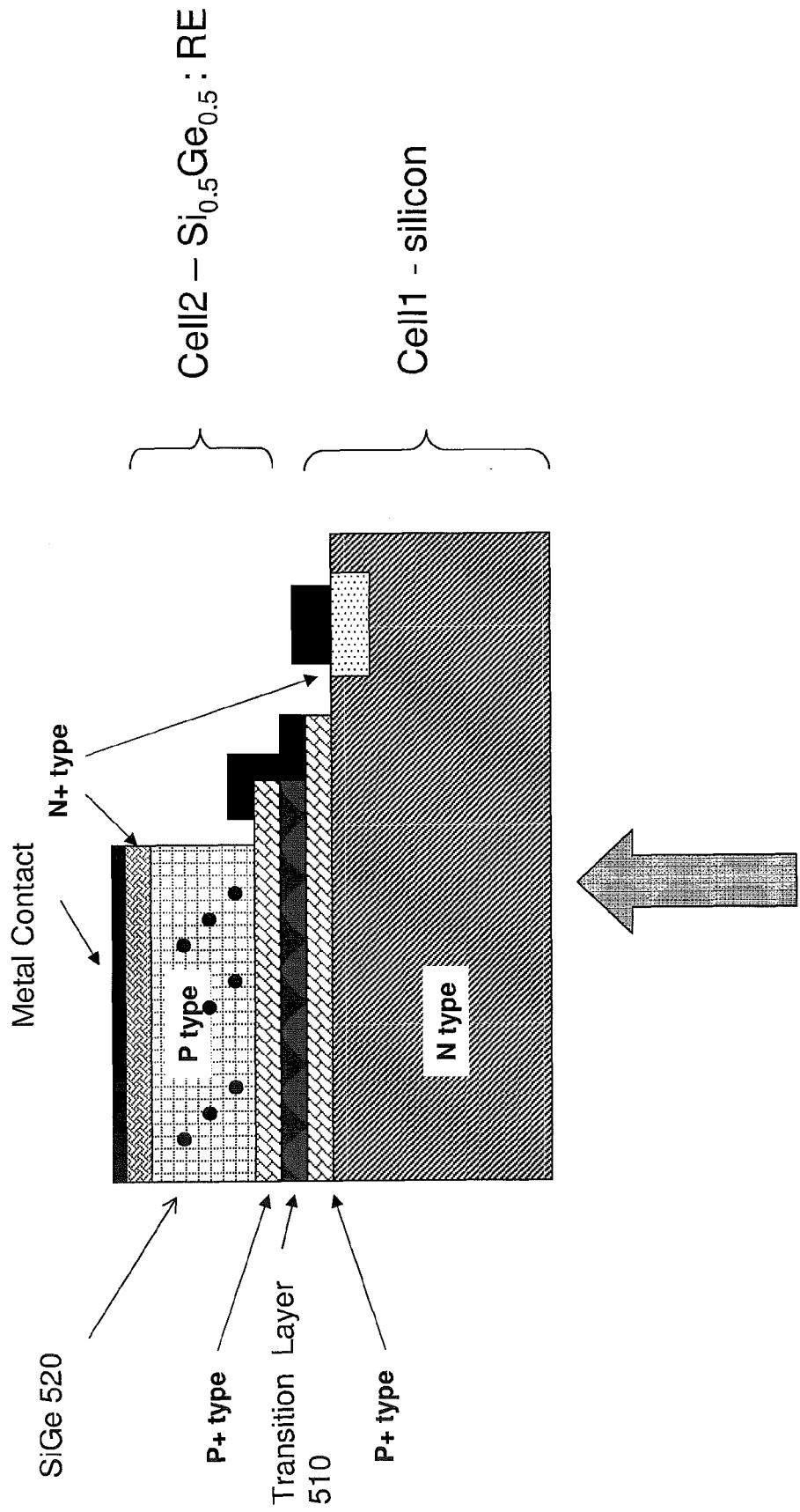
Figure 6:
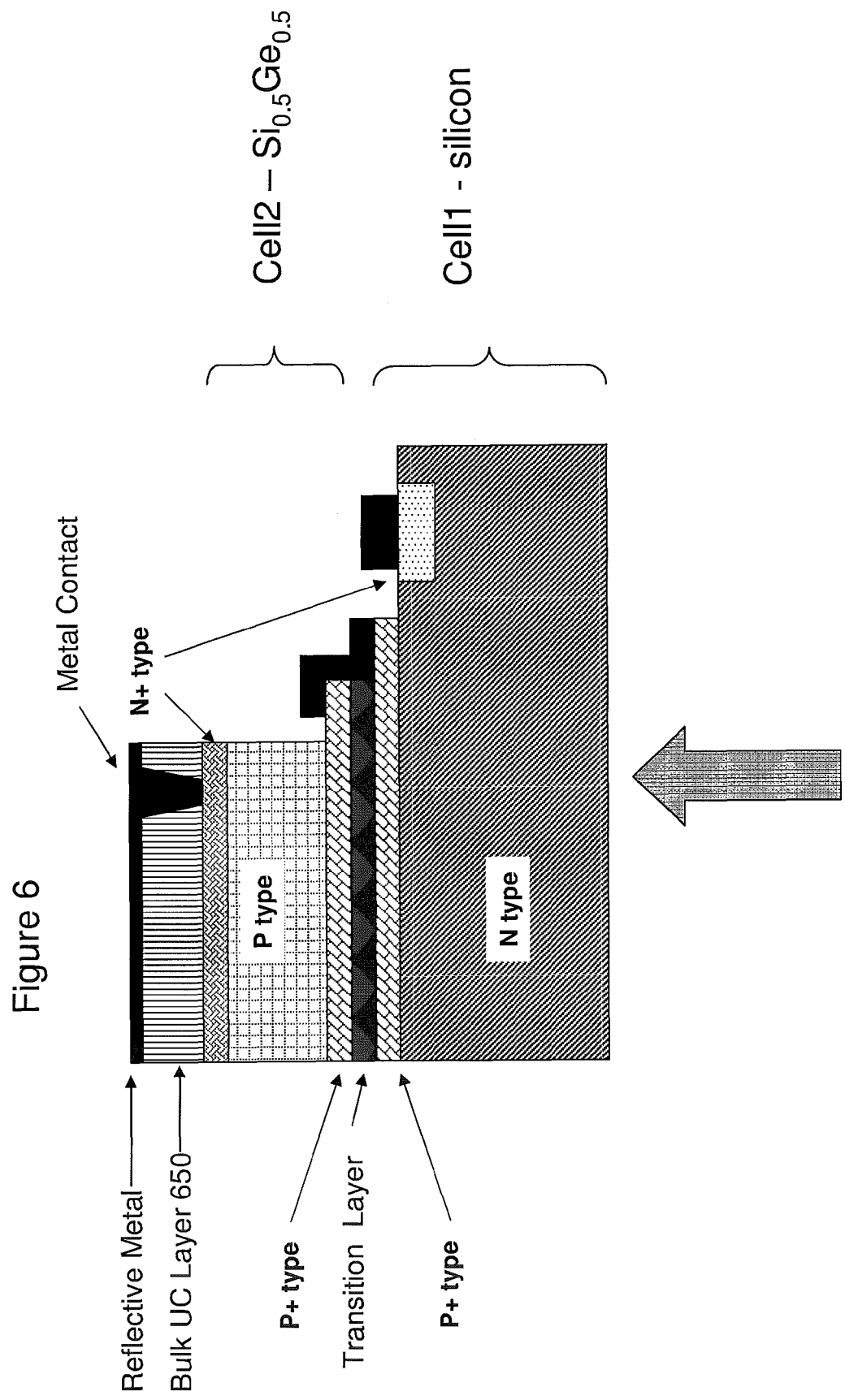

FIG. 1 shows the solar spectrum and portions, A, B and C available for up conversion, preferably by a REO based layer designed for the wavelength range of interest. FIG. 2 shows the variation of germanium content in a SiGe alloy versus the wavelength of incident radiation with energy at the upper band gap edge for Region A in FIG. 1. FIG. 3 shows the SiGe alloy lattice spacing versus Ge content and the lattice spacing of various rare earth binary oxides. FIG. 4 shows exemplary rare earth compounds for up conversion of radiation in Regions B and C. FIG. 5 shows one embodiment of an active tandem solar cell wherein two cells are connected by a REO transition layer 510 deposited on the silicon cell; the REO layer enables a $Si_{0.5}Ge_{0.5}$ layer 520 to be grown or deposited on top of the Si/REO structure. In this embodiment a SiGe layer also comprises an amount of rare earth, between about $10^{18}$ atoms/cm$^3$ to less than about $10^{23}$ atoms/cm$^3$, to enable up conversion of radiation passing through the transition layer into a $Si_{1-x}Ge_x$ layer. Optionally, the silicon and REO and SiGe layers are single crystal, poly-crystalline, micro or nano-crystalline or recrystallized large grains by post thermal processing. FIG. 6 shows an alternative embodiment wherein an REO based up conversion, UC, layer 650 is deposited over the SiGe layer and capped with a reflective metal layer for reflecting back into the SiGe layer radiation up converted by the UC layer. Embodiments citing SiGe layers are not limited to Group IV materials; Group III-V and Group II-VI are also disclosed.

Figure 8B:
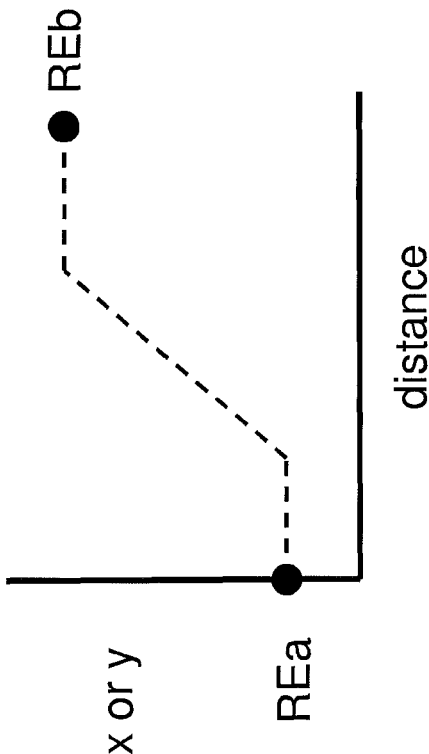
Figure 8A:
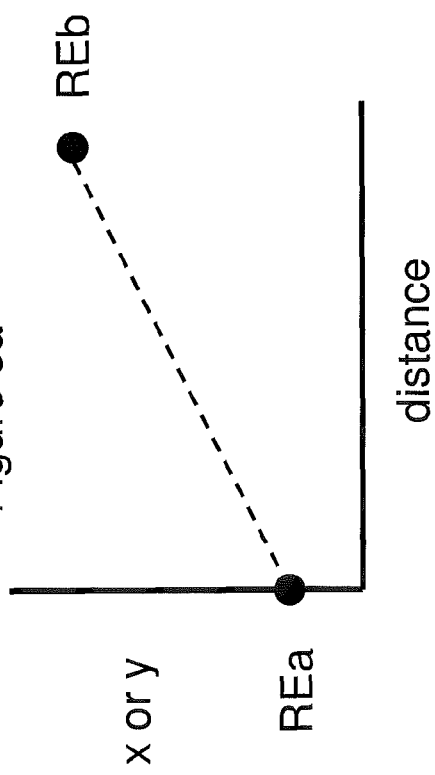
Figure 8D:
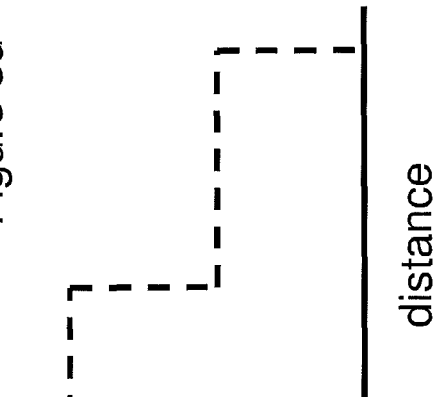
Figure 8C:
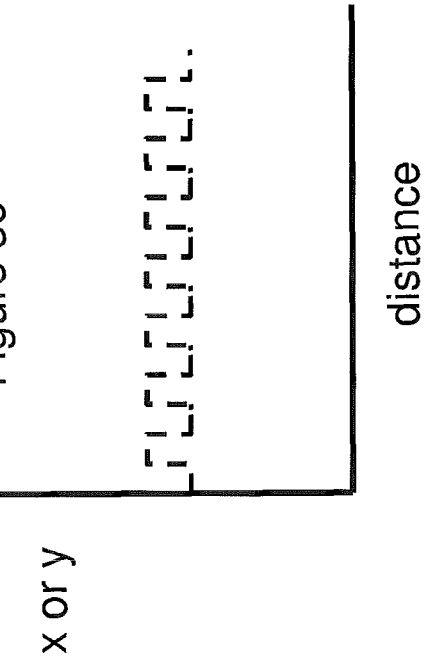

FIG. 7a shows an optional configuration for a transition layer being lattice matched at the lower interface of a first solar cell, optionally, silicon; by adjusting the ratio of RE1 and RE2 a different lattice matching is achieved at the upper surface to a second solar cell, optionally of SiGe. FIG. 7b shows an optional configuration for a rare earth based layer operable as an up conversion layer on top of a second solar cell with a metal reflector; again the dual rare earth material enables variation of lattice matching and conversion efficiency. FIGS. 8a, b, c and d show various schemes for composition variation of a two rare earth system across the vertical extent of a deposited rare earth layer of the type $RE1_xRE2_{1-x})_2O_3$; this example is of a stoichiometric ternary compound; as disclosed herein suitable rare earth compounds for transitioning and/or wavelength conversion may be binary, ternary, quaternary or higher; stoichiometric or not; in some examples Group IV elements are added; in some examples transition metals are added to boost efficiency. As disclosed herein exemplary variations of a rare earth transition layer may be linear from a first composition, REa, to a second composition, REb wherein a composition is described by $[RE1]_v[RE2]_w[RE3]_x[J1]_y[J2]_z$ wherein [RE] is chosen from a rare earth; [J1] and [J2] are chosen from a group consisting of oxygen (O), nitrogen (N), and phosphorus (P), such that $0 \leq v, w, z \leq 5$, and $0 < x, y \leq 5$ such that the composition of the rare earth layer adjacent the first semiconductor layer, REa is different from the composition of the rare earth layer adjacent the second semiconductor layer, REb. Alternative grading schemes are possible including interdigitated or superlattices or others known to one knowledgeable in the art.

Figure 9:
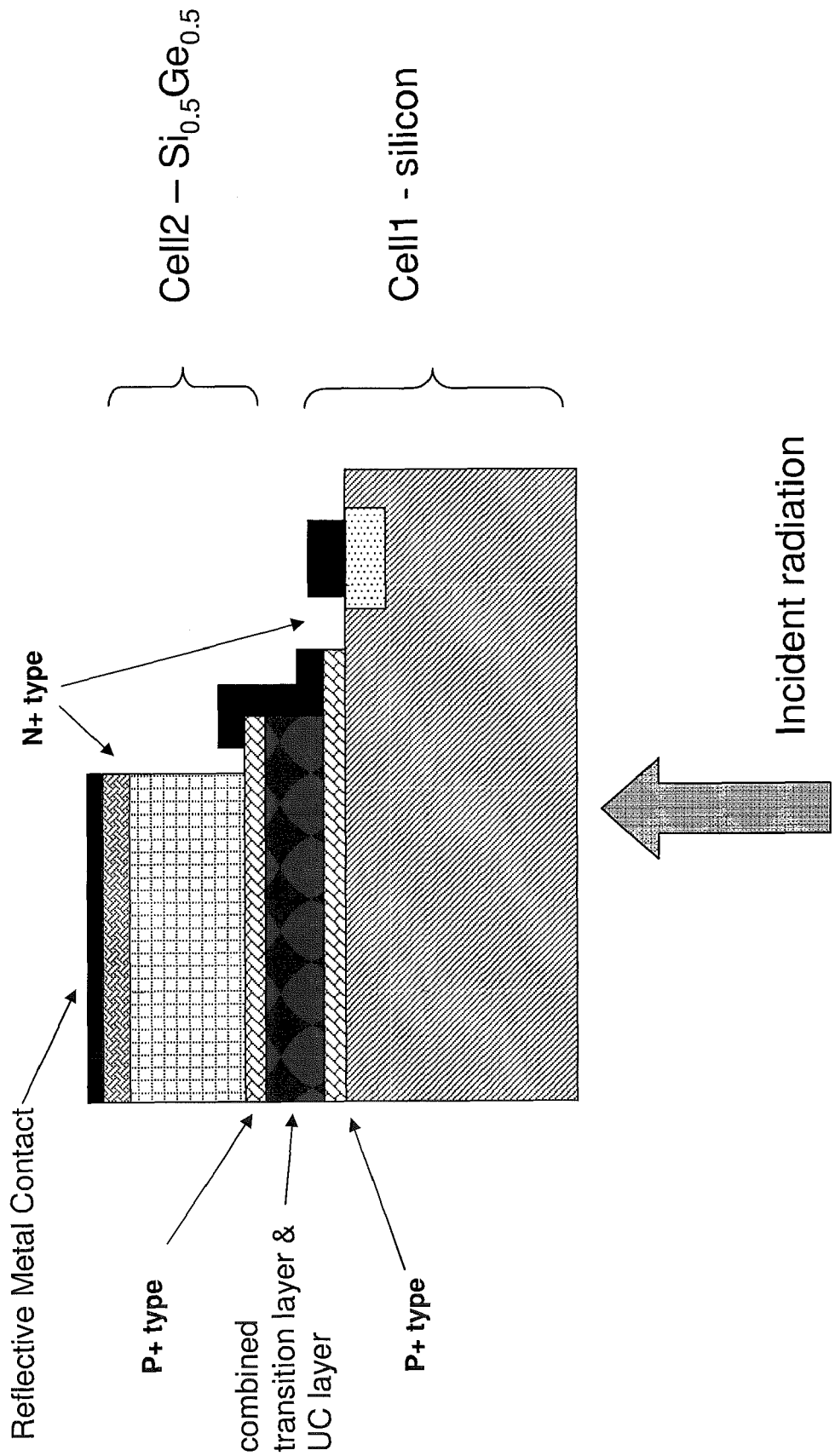
Figure 10:
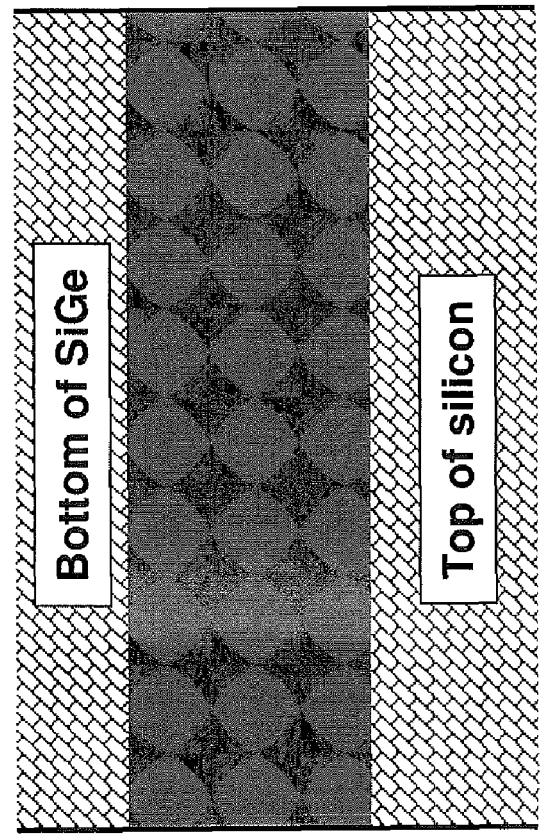
Figure 11C:
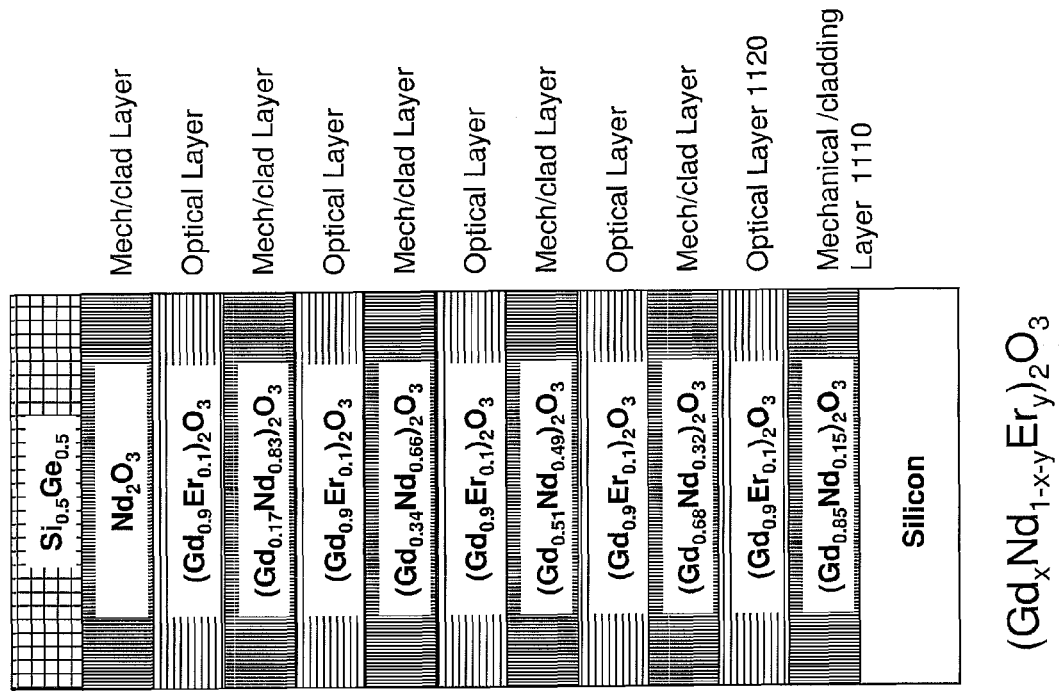
Figure 11A:
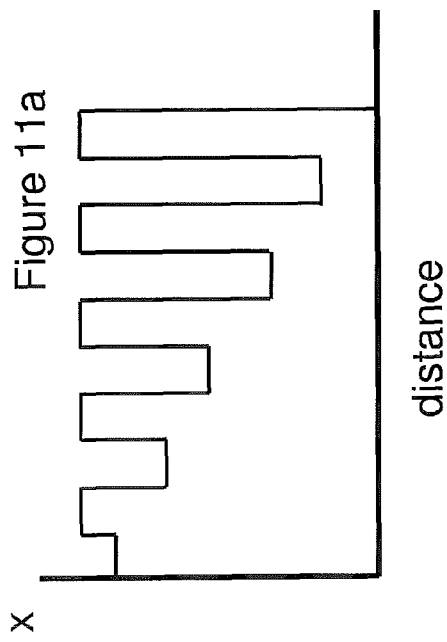
Figure 11B:
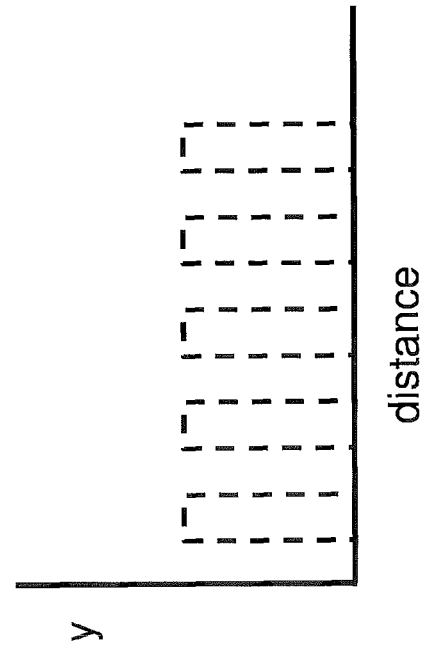

FIG. 9 shows an alternative embodiment wherein an up conversion layer is combined with a transition layer, located between the first semiconductor, optionally, silicon based, layer, or solar cell 1 and solar cell 2 of second semiconductor, optionally, silicon/germanium, based, content. FIG. 10 shows a key feature of this embodiment of the instant invention; in some embodiments a REO layer is lattice matched at an interface to the solar cell material just below it or just above it in a growth sequence frame of reference. As in FIG. 10, an exemplary $(RE1_xRE2_{1-x-y}RE3_y)_2O_3$ compound of first composition is lattice matched to a semiconductor upper surface; a $(RE1_uRE2_{1-u-v}RE3_v)_2O_3$ of second composition is lattice matched to a second semiconductor lower surface; in alternative embodiments exemplary compounds may be $(RE1_xRE2_{1-x})_2O_3$ (lower) and $(RE3_yRE4_{1-y})_2O_3$ (upper) where 1, 2, 3 and 4 may or may not be the same rare earth and O is one or a combination of oxygen, nitrogen and phosphorus. All embodiments of the instant invention are enabled to function with up and/or down conversion; figures may reference up conversion only; however down conversion and up conversion are possible embodiments of the instant invention. FIG. 10 is an exemplary transition/conversion layer with exemplary binary, ternary and quaternary rare earth based compounds. FIGS. 11 a and b show exemplary composition variation within a transition/conversion layer; FIG. 11c is an exemplary embodiment with specific compounds designated wherein certain layers are designated for lattice engineering 1110 and certain layers for optical conversion 1120.

Figure 12:
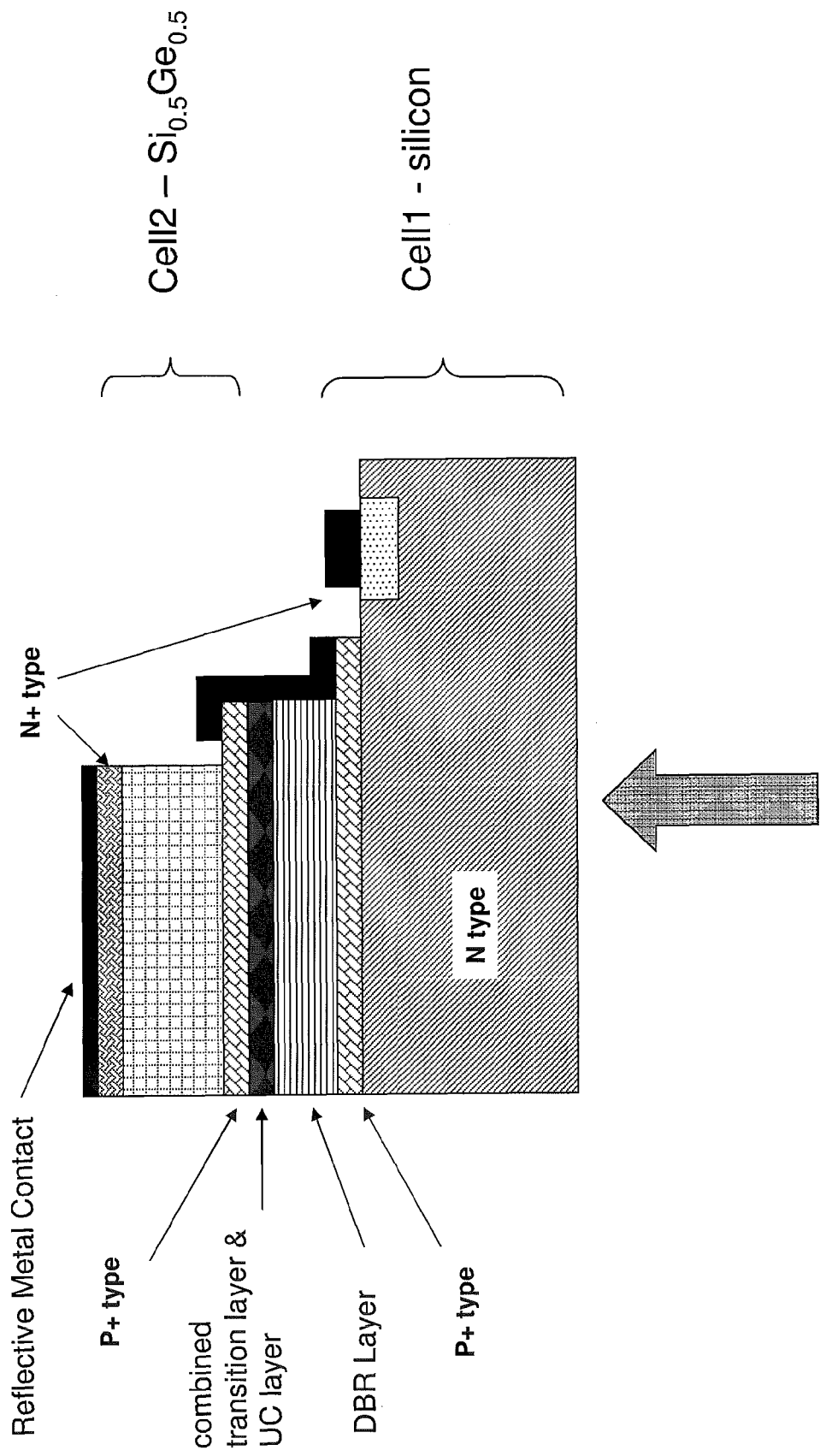
Figure 13:
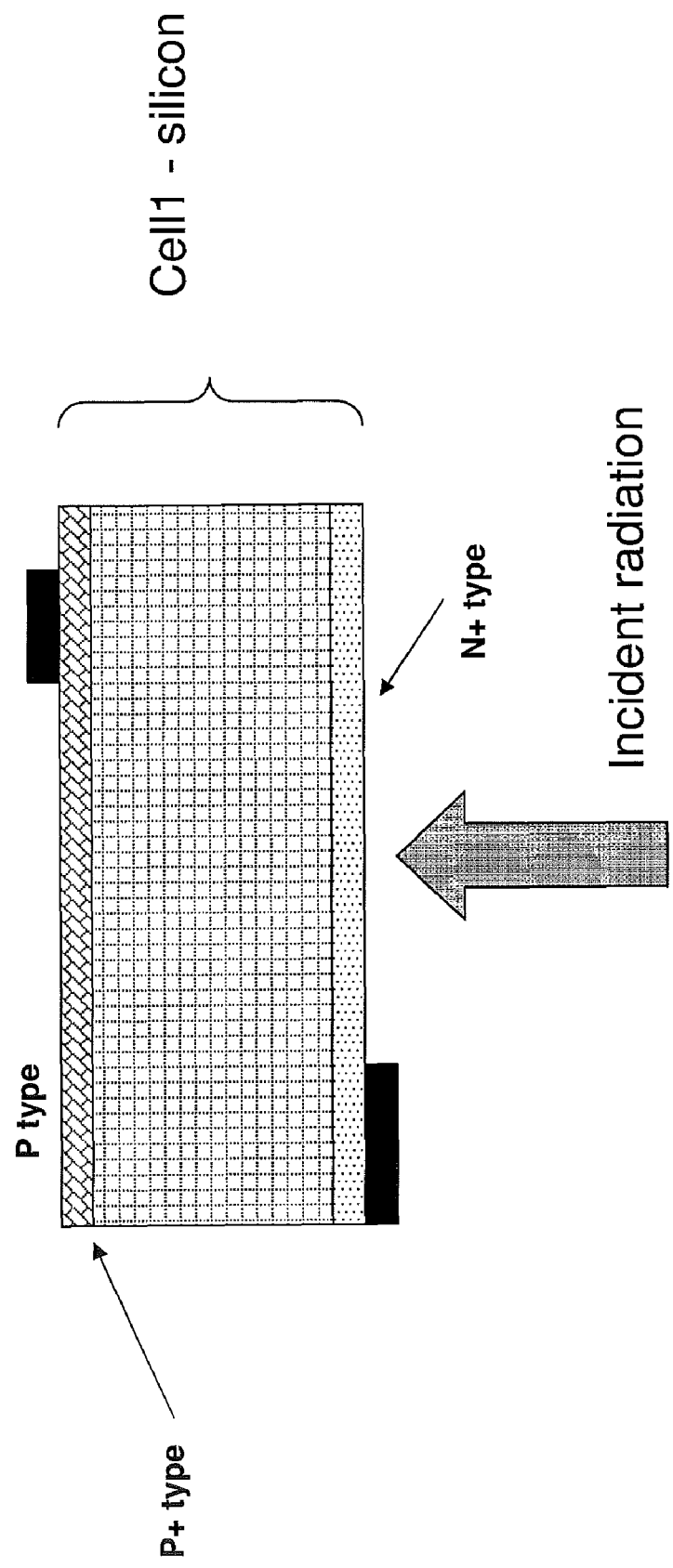
Figure 14:
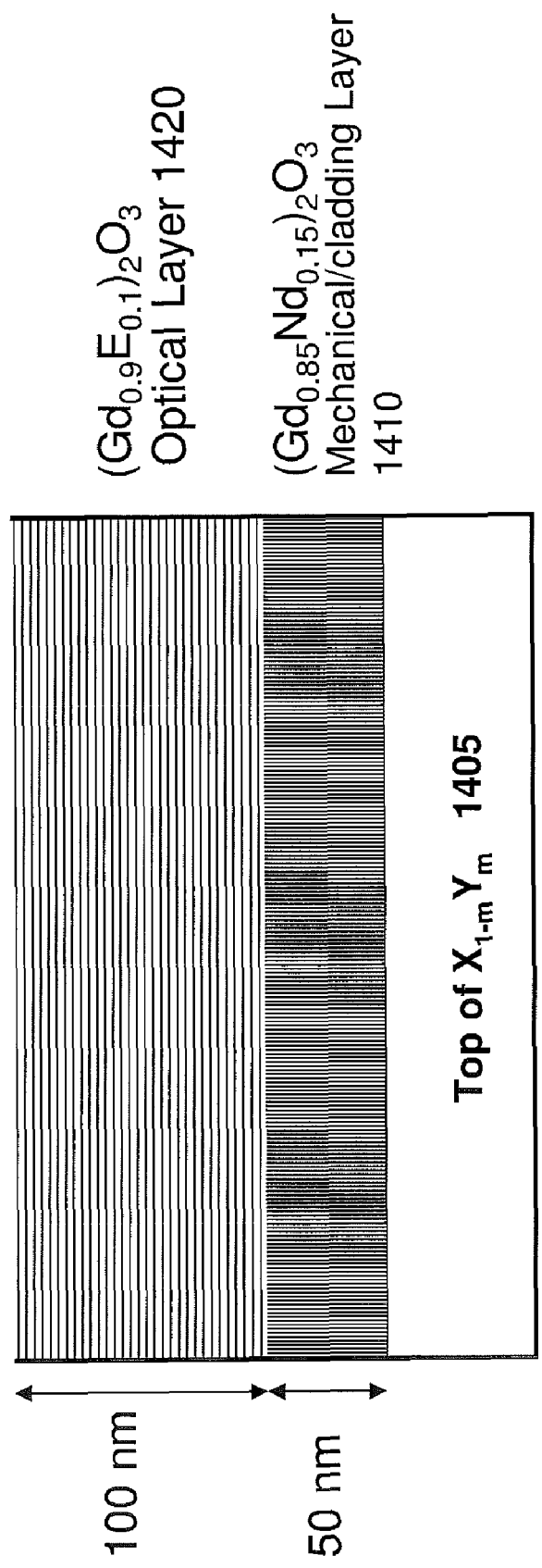
FIG. 14 shows exemplary transition and optical conversion layers.
Figure 15:
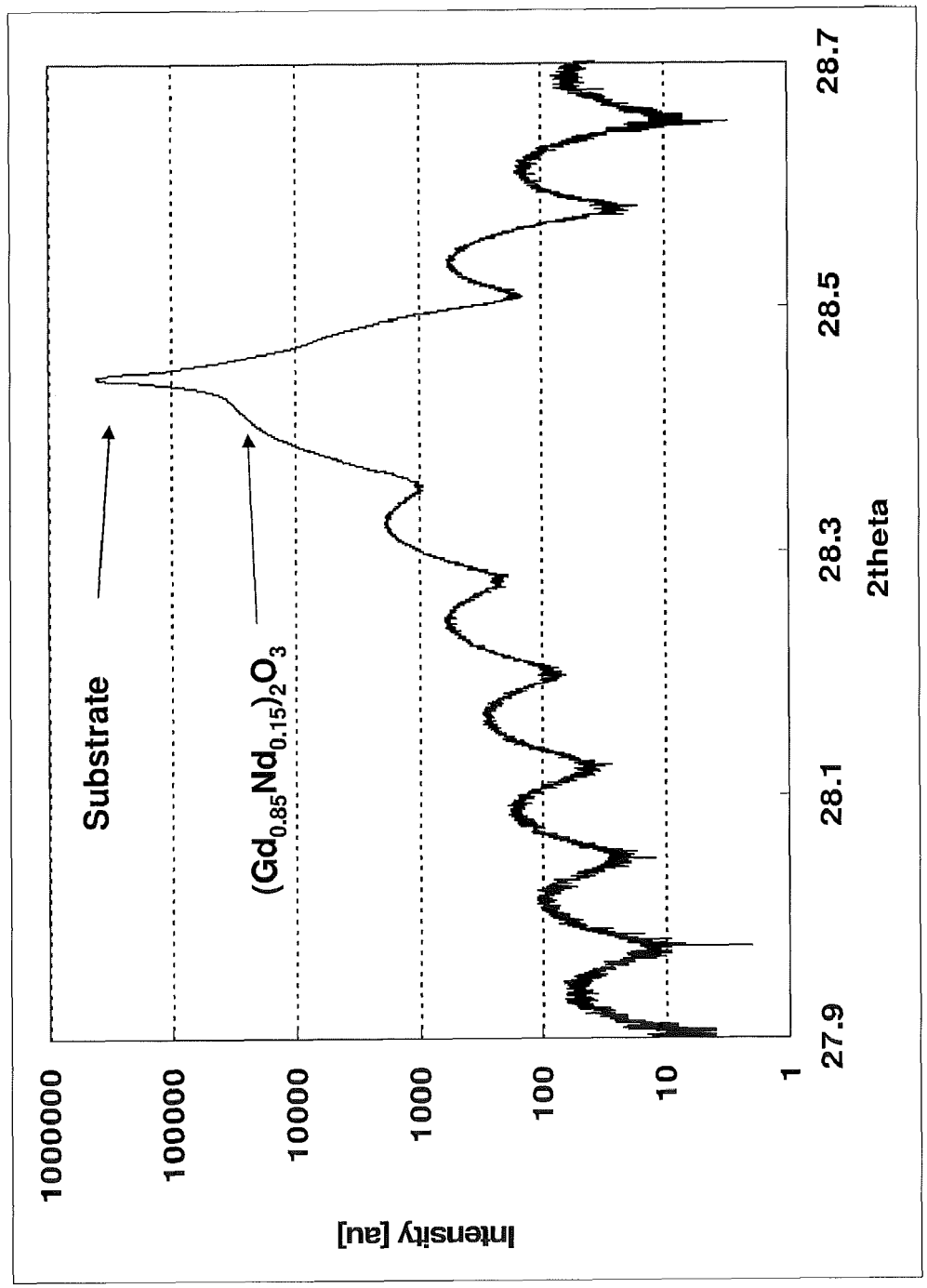
FIG. 15 is an x-ray scan of a test vehicle transition layer plus substrate structure showing results of strain engineering.

FIG. 12 shows an alternative version of FIG. 9 with a rare earth based distributed Bragg reflector, DBR, layer added. FIG. 13 shows an alternative embodiment for a first silicon cell with a front contact. FIG. 14 shows an exemplary transition layer 1410 coupled to an optical layer 1420 adjacent a first semiconductor layer 105. FIG. 14 is an exemplary embodiment showing specific compositions of an up converting layer, UC, adjacent a first solar cell of Group IV composition, optionally, silicon, and a transition layer. FIG. 15 is an x-ray scan of the transition layer and the silicon first cell test vehicle showing close lattice matching. FIG. 16a shows schematically a test structure used to demonstrate up conversion photo luminescence; FIG. 16b is a spectral scan of the up conversion results.

Alternative embodiments are disclosed of a transition layer between a first solar cell of X(1−x)Y(x) composition transitioning to a second solar cell of X(1−y)Y(y) composition, wherein X and Y may be any Group IV element, for example Si, Ge, or C. Up and/or down conversion layers are placed advantageously based on the lattice constant and materials of the adjoining solar cells; optionally, adjacent cell 1, between two transition layers or adjacent cell 2; optionally there are one or more transition layers and one or more up and down conversion layers. In some embodiments there are more than two solar cells in a structure. In some embodiments a solar cell may comprise Group IV elements; alternatively, Group III-V; alternatively, Group II-VI.

In some embodiments rare earth based layers are also performing a task of strain balancing, such that the net strain in the REO/Si(1-y)Ge(y) composite layer is effectively reduced over that of a single REO layer of the same net REO thickness grown on the same substrate, thus allowing a greater total thickness of REO to be incorporated into the structure before the onset of plastic deformation. In another embodiment rare earth based layers are strain balanced such that a critical thickness of the REO/Si(1-y)Ge(y) composite is not exceeded. In another embodiment REO/Si(1-y)Ge(y) composite layer acts to mitigate propagation of dislocations from an underlying Si(1-x)Ge(x) layer through to the overlying Si(1-z)Ge(z) layer thereby improving the crystallinity and carrier lifetime in the Si(1-z)Ge(z) layer. In another embodiment, the Si(1-x)Ge(x) has a narrower band gap than the Si(1-z)Ge(z) layer (i.e. x>z) such that the Si(1-z)Ge(z) layer and the Si(1-x)Ge(x) layers form a tandem solar cell. For example, solar radiation impinges upon the Si(1-z)Ge(z) layer first where photons of energy greater than the band gap of Si(1-z)Ge(z) are absorbed and converted to electrical energy. Photons with energy less than the band gap of Si(1-z)Ge(z) are passed through to the Si(1-x)Ge(x) layer where a portion may be absorbed.

In some embodiments rare earth oxide layers are performing a task of up conversion; a Si(1-z)Ge(z) layer is a photovoltaic energy converting layer with appropriate electrical contacts and doping profiles for such a function. In one embodiment a REO/Si(1-y)Ge(y) composite layer is performing a task of up conversion. In one embodiment rare earth oxide layers are performing a task of strain balancing, such that the net strain in the REO/Si(1-y)Ge(y) composite layer is effectively reduced over that of a single REO layer of the same net REO thickness grown on the same substrate. In one embodiment rare earth oxide layers are strain balanced such that critical thickness of the REO/Si(1-y)Ge(y) composite is not exceeded. In one embodiment a REO/Si(1-y)Ge(y) composite layer acts to mitigate propagation of dislocations from an underlying REO layer through to the overlying Si(1-z)Ge(z) layer thereby improving the crystallinity and carrier lifetime in the Si(1-z)Ge(z) layer.

In some embodiments a rare-earth oxide spectral conversion structure is fabricated on, underneath, or within solar cell devices for the purpose of modifying the spectral distribution of the incident radiation. In some embodiments a spectral conversion structure comprises a core layer, optionally, optically active, of $(Gd_{(1-x)}Er_{(x)})_2O_3$ or other ternary rare-earth compound, in contact with one or more cladding layers of $Gd_2O_3$ or other binary rare-earth compound. A cladding layer is designed such that there is substantially no overlap of excited energy levels with those in the core, hence a preference for $Gd_2O_3$ over other rare-earth oxides, since it has no energy levels within the solar spectrum. A core layer performs spectral conversion through absorption of light at one or more wavelengths, and emitting light at a different wavelength which is absorbed by a solar cell(s) and converted to electrical energy.

In some embodiments the energy levels in a core layer are isolated by cladding it with a material which contains no overlapping energy levels, thereby preventing resonant energy transfer from a core to quenching sites at the interfaces. This isolation effectively increases the lifetime of the energy levels in the core, thus improving the efficiency of optical wavelength conversion processed in the core layer.

In some embodiments a structure for converting incident radiation from one wavelength to another comprises a first layer comprising a rare earth compound; and a second layer comprising a semiconductor operable as a photovoltaic cell; such that incident radiation comprising a first wavelength incident on the first layer is converted into one or more wavelengths different than the first wavelength wherein at least a portion of the one or more wavelengths different than the first wavelength are absorbed by the second layer and converted into electrical energy. Optionally, the first layer comprises an initial cladding layer and a secondary cladding layer comprising a compound of composition $[RE1]_x[J]_y$ and a core layer comprising a compound of composition $(RE1_mRE2_n)_oJ_p$ positioned between the initial and secondary cladding layers wherein said first layer is positioned between said incident radiation and said second layer such that at least a portion of said incident radiation is down-converted from a higher energy to a lower energy before being absorbed by said second layer. Optionally, RE1 and RE2 are chosen such that there is no overlap between the energy levels in said cladding layers and said core layers and m, n, o, p, x, y>0 and J is chosen from a group comprising oxygen, nitrogen, phosphorous and combinations thereof.

Some embodiments comprise a third layer comprising an initial cladding layer and a secondary cladding layer comprising a compound of composition $[RE1]_e[J]_f$ and a core layer comprising a compound of composition $(RE1_aRE3_b)_cJ_d$ positioned between the initial and secondary cladding layers wherein the third layer is positioned such that said incident radiation has passed through said second layer into the initial cladding layer such that at least a portion of said incident radiation is up-converted from a lower energy to a higher energy by the third layer; optionally, RE1 and RE3 are chosen such that there is no overlap between the energy levels in said cladding layers and said core layers and a, b, c, d, e, f>0 and J is chosen from a group comprising oxygen, nitrogen, phosphorous and combinations thereof. Alternatively, a cladding layer may be $[RE1]_e[J]_f$ and a core layer may be $(RE2_aRE3_b)_cJ_d$.

In some embodiments a distributed Bragg reflector is positioned on said third layer away from said second layer comprising a plurality of sets of first and second layers wherein the first layer is of a composition $[RE]x[J]y$ and the second layer is of composition $[Si]m[Ge]n$ wherein x, y>0, and at least one of m or n>0 and J is chosen from oxygen, nitrogen, phosphorous or combinations thereof; optionally a reflector layer is placed such that the third layer is between the reflector layer and said second layer.

Some embodiments comprise a fourth layer comprising a secondary cladding layer comprising a compound of composition $[RE1]_g[J]_h$ and a core layer comprising a compound of composition $(RE1_iRE4_j)_kJ_l$ positioned between the secondary cladding layer and said secondary cladding layer of the third layer wherein g, h, i, j, k, l>0, and J is chosen from a group comprising oxygen, nitrogen, phosphorous and combinations thereof such that the incident radiation has passed through the third layer such that at least a portion of the incident radiation is up-converted from a lower energy to a higher energy by the fourth layer; optionally, a reflector layer is placed such that the secondary cladding layer of the fourth layer is between the reflector layer and the core layer of the fourth layer.

In some embodiments a structure for converting radiation from one wavelength to another comprises a plurality of layers comprising a semiconductor layer operable as a photovoltaic cell and a rare earth compound layer; and a substrate wherein the first of the plurality of layers comprises a semiconductor layer of composition $Si_{(1-m)}Ge_m$ and a rare earth layer of composition $[RE1]_x[J]_y$; the second of the plurality of layers comprises a semiconductor layer of composition $Si_{(1-n)}Ge_n$ and a rare earth layer of composition $[RE2]_u[J]_v$; and the plurality of layers is separated from the substrate by a semiconductor layer of composition $Si_{(1-o)}Ge_o$; wherein u, v, x, y>0, and m, n, o≧0 and J is chosen from a group comprising oxygen, nitrogen, phosphorous and combinations thereof; optionally, rare earth layers convert radiation from a low energy to a higher energy.

Rare earth oxide materials for spectral conversion have previously been disclosed in U.S. application Ser. No. 12/408,297. To improve the conversion efficiency of these materials, and/or reduce the thickness of spectral conversion material required, a 'sensitizer' component may be added to the spectral conversion material.

An example of a doping and interconnect scheme is when a rear p-type region of a silicon cell is connected through to the p-type region of a SiGe cell by a metalized via through a REO channel. Alternatively a REO layer may be doped to form a conductive buffer layer between a first solar cell and a second solar cell. Other embodiments are also possible, for example when p and n doping regions are reversed and a tunnel junction is used to create a two terminal device, rather than a three terminal device, as shown. Also possible is a device where the front metal contact and n-type doping region is placed at the back of the silicon layer, with a similar via contact scheme as is shown for the p-type silicon region. SiGe has a crystal lattice constant different to Si, such that when SiGe is deposited epitaxially directly on Si, the SiGe layer is strained. As the SiGe layer is grown thicker, the strain energy increases up to a point where misfit dislocations are formed in the SiGe film, which negatively impact performance of devices, including solar cell devices. In this invention, a REO buffer or transition layer may serve as a strain relief layer between Si and SiGe, such that misfit dislocations are preferentially created in the REO layer, thus reducing the dislocation density in the SiGe layer. The REO layer may also have compositional grading such that the REO surface in contact with the silicon layer is lattice matched to silicon, while the REO surface in contact with the SiGe layer is lattice matched to SiGe. For example, $(Gd_{0.81}Nd_{0.19})_2O_3$ has a lattice spacing of 10.863 Å, which is about twice the lattice spacing of silicon (10.8619 Å). For Si0.43Ge0.57, the band gap is 0.884 eV which allows the SiGe layer to absorb solar radiation in the band between 1100 to 1400 nm. Twice the lattice spacing of $Si_{0.43}Ge_{0.57}$ is 11.089 Å which is close to the lattice spacing of $Nd_2O_3$ (11.077 Å). Thus, by grading the composition of the REO layer from $(Gd_{0.81}Nd_{0.19})_2O_3$ to $Nd_2O_3$, the strain and dislocation network may be confined to the REO layer, thereby increasing the carrier lifetime and performance of the SiGe cell over that which would be obtained if the SiGe were grown directly on the Si. The instant invention discloses the use of a rare earth transition layer to function as a sink or getter for lattice defects created by the lattice mismatch between a first semiconductor layer and a rare earth layer transitioning to a second semiconductor layer. X-ray diffraction measurements were performed by using a Phillips X'pert Pro four circle diffractometer. Incident Cu Kα1 beam was conditioned using a Ge (220) four-bounce monochromator; diffracted beam was passed through a channel cut, two bounce (220) Ge analyzer in order to achieve higher resolution. The Bragg reflection from the Si (111) planes was measured to analyze the lattice parameter of the grown structure. X-ray diffraction spectrum shows intensity modulations around the fundamental reflections of the substrate, indicating a smooth epitaxial layer terminally as noted in FIG. 15.

In prior art of the same assignee a rare earth based structure is disclosed comprising a first and second region wherein the first region has a first and second surface and the second region has a first and second surface; and the second region has a composition of the form $[RE1]_v[RE2]_w[RE3]_x[J1]_y[J2]_z$, wherein [RE] is chosen from the disclosed rare earth group; [J1] and [J2] are chosen from a group consisting of oxygen (O), nitrogen (N), and phosphorus (P); wherein $0 \leq v, z \leq 5$; and $0 < w, x, y \leq 5$ such that the second region has a composition different than the first region and wherein the first surface of the second region is in direct contact with the second surface of the first region and the first region is comprised of a composition of the form $[RE1]_a[RE2]_b[RE3]_c[J1]_d[J2]_e$, wherein [RE] is chosen from the disclosed rare earth group; [J1] and [J2] are chosen from a group consisting of oxygen (O), nitrogen (N), and phosphorus (P); wherein $0 \leq b, c, e \leq 5$; and $0 < a, d \leq 5$. The structure as disclosed may be used in conjunction with similar structures additionally comprising a transition metal, TM and, optionally comprising a Group IV element or mixtures thereof.

In some embodiments one or more rare earth layers enable a transition from a semiconductor material of a first type and/or composition and/or orientation to a semiconductor material of a second type, composition and/or orientation; an embodiment is depicted in FIG. 6. As disclosed herein the rare-earth layers may function as a transition layer(s) between, for example, a silicon layer(s) and a germanium layer(s) such that the rare-earth layer(s) acts as a sink for defects attempting to propagate from an initial layer, optionally a silicon layer, to a final layer, optionally a germanium layer, during a growth or deposition process. A REO layer, operable as a transition layer, enables, for example, a $Si_{(1-m)}Ge_m$ layer to be grown or deposited on a different composition $Si_{(1-n)}Ge_n$ layer to a range thicker than the conventional critical layer thickness hence enabling different device structures; for example, one device may be a tandem solar cell where more efficient absorption of a portion of the spectrum not adsorbed by a first solar junction is enabled. Additionally, in some embodiments a transition layer is also optically active; for instance a transition layer is operable as an up converter for radiation around 1300 nm and longer.

A growth or deposition process may be any one, or combination, of those known to one knowledgeable in the art; exemplary processes include CVD, MOCVD, PECVD, MBE, ALE, PVD, electron beam evaporation, and multiple source PVD. An exemplary structure as shown in FIG. 9 may be a multiple-junction solar cell wherein one region comprises a silicon p-n junction cell, a second region is a rare-earth transition region functioning as a defect sink and an up converter and a third region is a germanium p-n junction cell; optionally, a first or second region may be alternative Group IV, Group III-V or Group II-VI semiconductors.

In some embodiments a rare-earth layer transition region comprises a first rare-earth portion of first composition adjacent to a first semiconductor region, a second rare-earth portion of second composition adjacent to a second semiconductor region and a third rare-earth portion of third composition separating the first and second rare-earth portion; in some embodiments the third rare earth composition varies from the first rare-earth composition to the second rare-earth composition in a linear fashion; alternatively the third rare earth composition may vary in a step-wise fashion; alternatively, the third rare earth region may comprise multiple layers, each with a distinct composition determined by a desired stress profile to facilitate the capture and/or annihilation of lattice defects as may be generated by the transition from the first and second semiconductor regions during a growth process and subsequent process steps. In some embodiments a third rare earth region may transition from a compressive stress to a tensile stress based upon the beginning and ending compositions.

High resolution transmission electron microscope image of another optional embodiment of rare-earth atom incorporated in silicon and/or silicon-germanium structures is shown in FIG. 94 of U.A. 2008/0295879. The germanium and erbium fractions may be used to tune the strain in the material. The Si/SiEr and Si/SiGeEr layers demonstrate that Ge is effective in reducing dislocation and threading dislocations vertically through the layers along the growth direction.

Atomic and molecular interstitial defects and oxygen vacancies in single crystal rare-earth oxide (REOx) can also be advantageously engineered via non-stoichiometric growth conditions. The atomic structure of singly and doubly positively charged oxygen vacancies ($O_v^+$, $O_v^{2+}$), and singly and doubly negatively charged interstitial oxygen atoms ($O_i^-$, $O_i^{2-}$) and molecules ($O_{2i}^-$, $O_{2i}^{2-}$) can be engineered in defective single crystals of $REO_{x=1.5\pm y}$, $0.1 \leq y \leq 1$). Singly and doubly negatively charged oxygen vacancies ($O_v^-$, $O_v^{2-}$) are also possible. Rare-earth metal ion vacancies and substitutional species may also occur and an oxygen vacancy paired with substitutional rare-earth atom may also occur. However, atomic oxygen incorporation is generally energetically favored over molecular incorporation, with charged defect species being more stable than neutral species when electrons are available from the rare-earth conduction band. Alternatively, nitrogen, N, or phosphorus, P, may replace the oxygen or used in various combinations.

Nitrogen-containing defects can be formed during growth of rare-earth-oxide using nitrogen and nitrogen containing precursors (e.g., $N_2$, atomic N, $NH_3$, NO, and $N_2O$). The role of such defects using nitrogen in oxides leads to an effective immobilization of native defects such as oxygen vacancies and interstitial oxygen ions and significantly reduce the fixed charge in the dielectric. Non-stoichiometric REOx films can be engineered to contain oxygen interstitials, (e.g., using oxygen excess and/or activated oxygen $O_2^*$, $O^*$) and/or oxygen vacancies (e.g., using oxygen deficient environment).

The process of vacancy passivation by molecular nitrogen is also possible. Atomic nitrogen is highly reactive and mobile once trapped in the oxide structure resulting in the more effective passivation of oxygen vacancies. The REOx materials generate positive fixed charge via protons and anion vacancies and can be effectively reduced by introduction of atomic nitrogen and/or molecular nitrogen.

Alternatively, in some embodiments, a first semiconductor layer may be polycrystalline, large grained crystalline or micro/nano crystalline; subsequent layers may also be polycrystalline, large grained crystalline or micro/nano crystalline. As used herein, large grained is defined as a grain of lateral dimension much larger than the dimension in the growth direction.

In some embodiments a solid state device comprising at least two solar cells in tandem for converting incident radiation into electrical energy comprises a first solar cell of first composition, a second solar cell of second composition and a third region of third composition separating the first solar cell from the second solar cell; wherein the first composition is different from the second composition and the third region comprises a first and second rare-earth such that a portion of the incident radiation passing through the first solar cell is converted into radiation of a different wavelength by the third region; optionally, a solid state device has first and second compositions comprising elements substantially from Group IV; optionally, a solid state device has a second composition comprising elements substantially from Groups III and V; optionally, a solid state device has a second composition comprising elements substantially from Groups II and VI; optionally, a solid state device has a third region with a composition described by $[RE1]_v[RE2]_w[RE3]_x[J1]_y[J2]_z$ wherein [RE] is chosen from a rare earth; [J1] and [J2] are chosen from a group consisting of Oxygen (O), Nitrogen (N), and Phosphorus (P), and $0 \leq v, w, z \leq 5$, and $0 < x, y \leq 5$; optionally, a solid state device has a third region comprising a first portion of fourth composition adjacent said first solar cell, a second portion of fifth composition, and a third portion of sixth composition separated from the first portion by the second portion and adjacent a second solar cell wherein the fifth composition is different from the fourth and sixth compositions; optionally, a solid state device has a second portion comprising a first surface adjacent said first portion and a second surface adjacent said third portion and said fifth composition varies between the first surface and the second surface; optionally, a solid state device has a second portion comprising a first surface adjacent said first portion and a second surface adjacent said third portion and comprises a superlattice with a structure comprising two layers of different composition which repeat at least once; optionally, a solid state device has a first portion in a first state of stress and a third portion in a second state of stress different than the first state of stress.

In some embodiments a solid state device for converting incident radiation to electrical energy comprises first and second semiconductor layers operable as tandem photovoltaic cells separated by a rare earth layer wherein the first semiconductor layer is of composition $X_{(1-m)}Y_m$; the second semiconductor layer is of composition $X_{(1-n)}Y_n$ and the rare Y earth layer is of a composition described by $[RE1]_v[RE2]_w[RE3]_x[J1]_y[J2]_z$ wherein n is different from m, and [RE] is chosen from a rare earth; [J1] and [J2] are chosen from a group consisting of oxygen (O), nitrogen (N), and phosphorus (P), and X and Y are chosen from a Group IV semiconductor such that $0 \leq n, m \leq 1$, $0 \leq v, w, z \leq 5$, and $0 < x, y \leq 5$ and the rare earth layer comprises a first and second rare-earth such that a portion of the incident radiation passing through the first semiconductor layer is converted into radiation of a different wavelength by the rare earth layer; optionally, a solid state device has a composition wherein $0 \leq w, z \leq 5$ and $0 < v, x, y \leq 5$ for a least a portion of the rare earth layer.

In some embodiments a solid state device for converting incident radiation to electrical energy comprises a first semiconductor layer operable as a photovoltaic cell, a second semiconductor layer operable as a photovoltaic cell and a rare earth layer comprising first and second regions of first and second rare earth compositions separating the first semiconductor layer from the second semiconductor layer; wherein the first rare earth composition is described by $[RE1]_v[RE2]_w[RE3]_x[J1]_y[J2]_z$ and the second rare earth composition is described by $[RE1]_a[RE2]_b[RE3]_e[J1]_d[J2]_e$ wherein [RE] is chosen from a rare earth; [J1] and [J2] are chosen from a group consisting of oxygen (O), nitrogen (N), and phosphorus (P), and $0 \leq a, b, e, v, w, z \leq 5$, and $0 < c, d, x, y \leq 5$ such that the first rare earth composition is different than the second rare earth composition wherein a portion of the incident radiation passing through the first semiconductor layer is converted into radiation of a different wavelength by the rare earth layer; optionally, a solid state device has first and second semiconductor materials chosen substantially from a group consisting of Group IV elements, Group III-V elements or Group II-VI elements; optionally, a solid state device has a rare earth layer comprising a superlattice of a structure that repeats at least once.

In some embodiments a solid state device for converting incident radiation into electrical energy comprises a first semiconductor layer operable as a photovoltaic cell, a second semiconductor layer operable as a photovoltaic cell in tandem with the first semiconductor layer a first rare earth layer of a first rare earth composition separating the first semiconductor layer from the second semiconductor layer and a second rare earth layer of a second rare earth composition separated from the first rare earth layer by the second semiconductor layer; wherein the first rare earth composition is described by $[RE1]_v[RE2]_w[RE3]_x[J1]_y[J2]_z$ and the second rare earth composition is described by $[RE1]_a[RE2]_b[RE3]_c[J1]_d[J2]_e$ wherein [RE] is chosen from a rare earth; [J1] and [J2] are chosen from a group consisting of oxygen (O), nitrogen (N), and phosphorus (P), and $0 \leq a, b, e, v, w, z \leq 5$, and $0 < c, d, x, y \leq 5$ such that the first rare earth composition is different than the second rare earth composition and the second rare earth layer is operable as a wavelength conversion layer up and/or down converting a portion of incident radiation; optionally, a solid state device has the first and second semiconductor materials chosen substantially from a group consisting of Group IV elements, Group III-V elements or Group II-VI elements; optionally, a solid state device has a second rare earth layer comprising a first region and a second region such that the composition of the first region is different from the composition of the second region; optionally, a solid state device has at least one of said first and second regions comprising a Group IV element.

The foregoing described embodiments of the invention are provided as illustrations and descriptions. They are not intended to limit the invention to a precise form as described. In particular, it is contemplated that functional implementation of invention described herein may be implemented equivalently in various combinations or other functional components or building blocks. Other variations and embodiments are possible in light of above teachings to one knowledgeable in the art of semiconductors, thin film deposition techniques, and materials; it is thus intended that the scope of invention not be limited by this Detailed Description, but rather by Claims following. All patents, patent applications, and other documents referenced herein are incorporated by reference in their entirety for all purposes, unless otherwise indicated.

We claim:

1. A solid state device comprising at least two solar cells in tandem for converting incident radiation into electrical energy comprising;
a first solar cell of first composition;
a second solar cell of second composition; and
a third region of third composition separating the first solar cell from the second solar cell;
wherein the first composition is different from the second composition and the third region consists of a first and second rare-earth and at least one element chosen from a group consisting of oxygen, nitrogen and phosphorous such that a portion of the incident radiation passing through the first solar cell is converted into radiation of a different wavelength by the third region for subsequent passage through the second solar cell; wherein said first and second compositions comprise elements substantially from Group IV.

2. A solid state device of claim 1 wherein said composition of said third region consists of compounds described by $[RE2]_w[RE3]_x[J1]_y[J2]_z$ wherein [RE] is chosen from a rare earth; [J1] and [J2] are chosen from a group consisting of Oxygen (O), Nitrogen (N), and Phosphorus (P), and $0 \leq z \leq 5$, and $0 < w, x, y \leq 5$.

3. A solid state device of claim 2 wherein said third region comprises,
a first portion of fourth composition adjacent said first solar cell;
a second portion of fifth composition; and
a third portion of sixth composition separated from the first portion by the second portion and adjacent said second solar cell wherein the fifth composition is different from the fourth and sixth compositions.

4. A solid state device of claim 3 wherein said second portion comprises a first surface adjacent said first portion and a second surface adjacent said third portion and said fifth composition varies between the first surface and the second surface.

5. A solid state device of claim 3 wherein said second portion comprises a first surface adjacent said first portion and a second surface adjacent said third portion and comprises a superlattice with a structure comprising two layers of different composition which repeat at least once.

6. A solid state device of claim 3 wherein said first portion is in a first state of stress and said third portion is in a second state of stress different than the first state of stress.

7. The solid state device of claim 1 wherein the first solar cell is of composition $X_{(1-m)}Y_m$ and the second solar cell is of composition $X_{(1-n)}Y_n$ wherein n is different from m, and X and Y are chosen from a Group IV semiconductor such that $0 \leq n, m \leq 1$.

8. The device of claim 7 wherein the third region consists of a composition described by $[RE1]_v[RE3]_x[J1]_y[J2]_z$ and [RE] is chosen from a rare earth; [J1] and [J2] are chosen from a group consisting of oxygen (O), nitrogen (N), and phosphorus (P) and wherein $0 \leq z \leq 5$ and $0 < v, x, y \leq 5$ for a least a portion of the rare earth layer.

9. A solid state device comprising at least two photovoltaic cells in tandem; for converting incident radiation to electrical energy comprising,
first semiconductor layer operable as a photovoltaic cell;
second semiconductor layer operable as a photovoltaic cell; the first semiconductor layer and the second semiconductor layer being arranged in tandem; and
a rare earth layer comprising first and second regions of first and second rare earth compositions separating the first semiconductor layer from the second semiconductor layer;
wherein the first rare earth consists of a composition described by $[RE1]_v[RE2]_w[RE3]_x[J1]_y[J2]_z$ and the second rare earth consists of a composition is described by $[RE1]_a[RE2]_b[RE3]_c[J1]_d[J2]_e$ wherein [RE] is chosen from a rare earth; [J1] and [J2] are chosen from a group consisting of oxygen (O), nitrogen (N), and phosphorus (P), and $0 \leq a, b, e, v, w, z \leq 5$, and $0 < c, d, x, y \leq 5$ such that the first rare earth composition is different than the second rare earth composition wherein a portion of the incident radiation passing through the first semiconductor layer is converted into radiation of a different wavelength by the rare earth layer for subsequent passage through the second semiconductor layer.

10. The device of claim 9 wherein the first and second semiconductor materials are chosen substantially from a group consisting of Group IV elements.

11. The device of claim 9 wherein said rare earth layer comprises a superlattice of a structure that repeats at least once.

12. A solid state device for converting incident radiation to electricity comprising,
first semiconductor layer operable as a photovoltaic cell;
second semiconductor layer operable as a photovoltaic cell in tandem with the first semiconductor layer;
a first rare earth layer consisting of a first rare earth composition separating the first semiconductor layer from the second semiconductor layer; and
a second rare earth layer consisting of a second rare earth composition separated from the first rare earth layer by the second semiconductor layer; wherein
the first rare earth composition is described by $[RE1]_v[RE2]_w[RE3]_x[J1]_y[J2]_z$ and the second rare earth composition is described by $[RE1]_a[RE2]_b[RE3]_c[J1]_d[J2]_e$ wherein [RE] is chosen from a rare earth; [J1] and [J2] are chosen from a group consisting of oxygen (O), nitrogen (N), and phosphorus (P), and $0 \leq a, b, e, v, w, z \leq 5$, and $0 < c, d, x, y \leq 5$ such that the first rare earth composition is different from the second rare earth composition and at least one of the first or second rare earth layers is operable as a wavelength conversion layer such that a portion of the incident radiation passing through the first semiconductor layer is converted into radiation of a different wavelength by the one or more wavelength conversion layers for subsequent passage through the second semiconductor layer.

13. The device of claim 12 wherein the first and second semiconductor materials are chosen substantially from a group consisting of Group IV elements.

14. The device of claim 12 wherein the second rare earth layer comprises a first region and a second region such that the composition of the first region is different from the composition of the second region.

15. The device of claim 14 wherein at least one of said first and second regions comprises a Group IV element.

* * * * *